United States Patent
Hayase et al.

(10) Patent No.: US 8,637,680 B2
(45) Date of Patent: Jan. 28, 2014

(54) DYE-SENSITIZED SOLAR CELL, PHOTOELECTRIC CONVERSION ELEMENT, AND DYE FOR USE IN THE SOLAR CELL AND THE ELEMENT

(75) Inventors: Shuzi Hayase, Kitakyushu (JP); Yoshihiro Yamaguchi, Kitakyushu (JP); Shyam Sudhir Pandey, Kitakyushu (JP)

(73) Assignees: Nippon Steel & Sumikin Chemical Co., Ltd., Tokyo (JP); National University Corporation Kyushu Institute of Technology, Fukuoka (JP)

( * ) Notice: Subject to any disclaimer, the term of this patent is extended or adjusted under 35 U.S.C. 154(b) by 1 day.

(21) Appl. No.: 13/255,095

(22) PCT Filed: Mar. 10, 2010

(86) PCT No.: PCT/JP2010/054014
§ 371 (c)(1),
(2), (4) Date: Oct. 7, 2011

(87) PCT Pub. No.: WO2010/104117
PCT Pub. Date: Sep. 16, 2010

(65) Prior Publication Data
US 2012/0029206 A1   Feb. 2, 2012

(30) Foreign Application Priority Data

Mar. 12, 2009 (JP) ................. 2009-059685

(51) Int. Cl.
C07D 209/02 (2006.01)
C07D 209/04 (2006.01)
H01L 31/042 (2006.01)

(52) U.S. Cl.
USPC ................. 548/455; 548/490; 136/263

(58) Field of Classification Search
None
See application file for complete search history.

(56) References Cited

U.S. PATENT DOCUMENTS

2011/0315203 A1   12/2011   Hayase et al.

FOREIGN PATENT DOCUMENTS

| EP | 0 911 841 A2 | 4/1999 |
| EP | 991092 A2 * | 4/2000 |
| JP | 2001-52766 A | 2/2001 |
| JP | 2001076773 A * | 3/2001 |
| JP | 2001-266963 A | 9/2001 |
| JP | 2003-338326 A | 11/2003 |
| JP | 2009-9931 A | 1/2009 |
| WO | WO-2010/103759 A1 | 9/2010 |

OTHER PUBLICATIONS

Pandey et al Organic Electronics 11 (2010) 419-426.*
Kuster et al Dyes and Pigments 87 (2010) 30-38.*
Usagawa et al Appl. Phys. Express 2 (2009) 062203-1 to 062203-3.*
International Preliminary Report on Patentability for Application No. PCT/JP2010/054014 mailed Oct. 27, 2011.
International Search Report for the Application No. PCT/JP2010/054014 mailed May 25, 2010.
Chen, Yousheng et al., "Highly Efficient Co-Sensitization of Nanocrystalline $TiO_2$ Electrodes with Plural Organic Dyes", New Journal of Chemistry, Royal Society of Chemistry, 2005, vol. 29, pp. 773-776.
Yum, Jun-Ho et al., "Efficient Co-Sensitization of Nanocrystalline $TiO_2$ Films by Organic Sensitizers", Chemical Communication, 2007, pp. 4680-4682.
Yum, Jun-Ho et al., "Efficient Far Red Sensitization of Nanocrystalline $TiO_2$ Films by an Unsymmetrical Squaraine Dye", J. Am. Chem. Soc., 2007, vol. 129, No. 34, pp. 10320-10321.
Choi, Hyunbong et al., "Stepwise Cosensitization of Nanocrystalline $TiO_2$ Films Utilizing $Al_2O_3$ Layers in Dye-Sensitized Solar Cells", Angew. Chem., 2008, vol. 120, pp. 8383-8387.
Supplementary European Search Report for the Application No. EP 10 75 0870 dated Jan. 21, 2013.

* cited by examiner

*Primary Examiner* — Nyeemah A Grazier
(74) *Attorney, Agent, or Firm* — Cheng Law Group, PLLC (57) ABSTRACT

Provided are a squarylium dye having a carboxyindolenine structure and an N-alkyl substituent, and a photoelectric conversion element having high photoelectric conversion efficiency in a near-infrared region and a dye-sensitized solar cell, both of which are produced using the squarylium dye. The photoelectric conversion element or dye-sensitized solar cell uses a compound represented by the formula (1) as the squarylium dye. In the formula (1), $R_1$ and $R_2$ represent a substituted or unsubstituted C5 to C30 alkyl group; X represents $C(CH_3)_2$; and A and B represent a carboxy group.

9 Claims, 3 Drawing Sheets

DYE-SENSITIZED SOLAR CELL, PHOTOELECTRIC CONVERSION ELEMENT, AND DYE FOR USE IN THE SOLAR CELL AND THE ELEMENT

TECHNICAL FIELD

The present invention relates to a squarylium dye, and a photoelectric conversion element and a dye-sensitized solar cell each using the dye.

BACKGROUND ART

A photoelectric conversion element is used in an optical sensor or a photovoltaic device such as a solar cell. A photoelectric conversion element using dye-sensitized semiconductor fine particles is known in Patent Literature 1 or the like.

As the solar cell, a solar cell using a monocrystalline, polycrystalline, or amorphous silicon semiconductor is widely used, for example, in an electrical product such as a calculator and for residence. However, such solar cell using a silicon semiconductor is produced by using a high-precision process such as plasma CVD or a high-temperature crystal growth process, and hence the production requires a large energy and high production cost because the process requires an expensive apparatus which needs vacuum.

Therefore, there has been proposed, for example, a dye-sensitized solar cell using a material obtained by adsorbing a photosensitive dye such as a ruthenium metal complex to an oxide semiconductor such as titanium oxide as a solar cell which may be produced at a low cost. Specifically, for example, the dye-sensitized solar cell is produced so that an electrolyte solution fills a space between a negative electrode including, as a semiconductor layer, titanium oxide or the like having a dye made of, for example, a ruthenium complex adsorbed on the surface, on the transparent conductive layer side of a transparent insulating material such as a transparent glass plate or a transparent resin plate provided with a transparent conductive layer such as indium-doped tin oxide, and a transparent insulating material provided with a metal layer or conductive layer serving as a positive electrode and made of platinum, such as a transparent glass plate or a transparent resin plate. If the dye-sensitized solar cell is irradiated with light, in the negative electrode, electrons of the dye, which have absorbed the light, are excited and the excited electrons move to the semiconductor layer and are introduced to the transparent electrode, while in the positive electrode, the electrolyte is reduced by electrons from the conductive layer. The reduced electrolyte is oxidized by the transfer of the electrons to the dye, and the dye-sensitized solar cell is considered to generate an electric power by such cycle.

Currently, the dye-sensitized solar cell has low photovoltaic energy efficiency relative to an irradiated light energy compared with a silicon solar cell, and enhancement of the efficiency is an important problem in the production of an effective dye-sensitized solar cell. The efficiency of the dye-sensitized solar cell is considered to be affected by characteristics of elements that construct the solar cell and a combination of the elements, and a variety of attempts have been made. In particular, for a dye having a photosensitization effect, much attention has been focused on the development of a more efficient sensitizing dye. Ru dyes are now known as highly efficient dyes, but Ru is a transition metal and thus is expensive. Thus, much attention has been focused on the development of inexpensive and highly efficient dyes. Further, the dyes each have high photoelectric conversion efficiency in a visible light region but have low photoelectric conversion efficiency in a near-infrared region, and hence it is desired to develop a dye having an absorption band in the vicinity of the near-infrared region.

As organic dyes having such absorption band in the vicinity of the near-infrared region, some compounds are known in Patent Literature 1, Non Patent Literature 1, and Non Patent Literature 2. Dye-sensitized solar cells including a mixture of an organic dye having an absorption band in the vicinity of the near-infrared region and an organic dye having an absorption band in another region are disclosed in Patent Literature 2, Non Patent Literature 3, and Non Patent Literature 4. These literatures also disclose squarylium dyes.

CITATION LIST

Patent Literature

[PTL 1] JP 4148374 B
[PTL 2] JP 2000-268892 A

Non Patent Literature

[NPL 1] Chemical Communication, 2007, p 4680-4682
[NPL 2] J. Am. Che. Soc., 2007, 129, p 10320-10321
[NPL 3] New J. Chem., 2005, 29, p 773-776
[NPL 4] Angew. Chem., 2008, 120, p 8383-8387

Patent Literature 1 discloses a photoelectric conversion element and a dye-sensitized solar cell and describes an example of a polymethine dye used therefor. The polymethine dye used in Patent Literature 1 is represented by a general formula and contains very many compounds. The compounds exemplified in the literature include a squarylium dye having a carboxyindolenine structure and an ethyl group and a squarylium dye having a carboxyethyl group. However, the literature does not disclose a long-chain N-substituted alkyl squarylium dye. It is understood that the squarylium dye as used herein means a squarylium dye having a carboxyindolenine structure and an N-substituent.

Non Patent Literature 1 and Non Patent Literature 2 disclose examples of squarylium dyes including a methyl group or an ethyl group and a C8 alkyl group, one of which has a carboxyindolenine skeleton and the other has an indolenine skeleton, but the dyes each have low conversion efficiency. Further, the dyes have asymmetric structures, and hence the dyes are synthesized in a low yield and are difficult to purify, resulting in the risk of an increase in cost.

Patent Literature 2 and Non Patent Literatures 3 and 4 disclose examples of a dye-sensitized solar cell including a mixture of a short-wavelength region dye and a long-wavelength region dye, but the literatures disclose only almost the same facts for the squarylium dye as those in Patent Literature 1.

SUMMARY OF INVENTION

In general, a squarylium dye is easy to undergo association and is considered to easily cause energy transfer between dyes as a dye for a photoelectric conversion element or for a solar cell. In the case where the N-substituent is a short alkyl group, the dye is easy to undergo association and may cause energy transfer between dyes and lose its activity.

The present invention has been made in view of the above-mentioned problems, and an object of the present invention is to provide a novel dye capable of improving photoelectric conversion efficiency in a near-infrared region and to provide a dye-sensitized solar cell and a photoelectric conversion element each using the dye. Another object of the present invention is to provide a squarylium dye which may be easily synthesized and hardly loses its activity and is suitable for a near-infrared region. Still another object of the present invention is to provide a dye-sensitized solar cell and a photoelectric conversion element each capable of improving photoelectric conversion efficiency in a wide range of region.

The present invention relates to a dye-sensitized solar cell, including a squarylium dye, in which the squarylium dye includes a compound represented by the following formula (1):

(1)

where: $R_1$ and $R_2$ each represent a substituted or unsubstituted C5 to C30 alkyl group; X's each represent $C(CH_3)_2$; and A and B each represent a carboxy group.

In the above-mentioned formula (1), $R_1$ and $R_2$ each represent preferably a substituted or unsubstituted C5 to C18 alkyl group, more preferably a substituted or unsubstituted C8 to C12 alkyl group.

In the above-mentioned dye-sensitized solar cell, it is advantageous to use to a squarylium dye represented by the formula (1) and a squarylium dye represented by the following formula (2):

(2)

where $R_3$ represents a substituted or unsubstituted C2 to C30 alkyl group.

Further, the present invention relates to a dye-sensitized solar cell, including a squarylium dye, in which the squarylium dye includes a squarylium dye having a carboxyindolenine skeleton represented by the above-mentioned formula (2).

Further, the present invention relates to a photoelectric conversion element, including a squarylium dye, in which the squarylium dye includes a compound represented by the above-mentioned formula (1).

Further, the present invention relates to a squarylium dye for a photoelectric conversion element or a dye-sensitized solar cell represented by the above-mentioned formula (1) or formula (2).

DESCRIPTION OF EMBODIMENTS

The photoelectric conversion element or dye-sensitized solar cell of the present invention includes any one or both of a squarylium dye represented by the formula (1) and a squarylium dye represented by the formula (2) as a sensitizing dye. It should be noted that the dye-sensitized solar cell utilizes the photoelectric conversion element, and many descriptions about the cell and element are common. Therefore, common descriptions are made for the dye-sensitized solar cell.

In the photoelectric conversion element or dye-sensitized solar cell using a squarylium dye of the present invention, the squarylium dye is a compound represented by the formula (1), in which R1 and R2 in the formula (1) each represent a substituted or unsubstituted C5 to C30 alkyl group. The compound is referred to as squarylium dye represented by the formula (1). The squarylium dye represented by the formula (1) is also the squarylium dye of the present invention.

In the formula (1), X's each represent a divalent group represented by $C(CH_3)_2$, and A and B each represent a carboxy group (—COOH). $R_1$ and $R_2$ each represent a substituted or unsubstituted C5 to C30 alkyl group, preferably a substituted or unsubstituted C5 to C18 alkyl group, more preferably a substituted or unsubstituted C8 to C12 alkyl group. $R_1$ and $R_2$ may be the same or different, and if $R_1$ and $R_2$ are the same, the compound has an advantage of easy synthesis and purification.

In the case where $R_1$ and $R_2$ each represent a substituted alkyl group, preferred examples of the substituent include a carboxy group. In the case where the substituent has a carbon atom, the carbon atom is included in the number of carbon atoms. Preferred is an unsubstituted alkyl group, and in the case of the substituted alkyl group, the substituent is an alkyl group substituted with one carboxy group. $R_1$ and $R_2$ each represent preferably a branched or linear C8 to C12 alkyl group, more preferably a C8 to C12 n-alkyl group.

While the exact reasons are unknown, a long-chain C5 to C30 alkyl group is considered to prevent the association of the squarylium dye and to reduce a loss of charge separation due to energy transfer between dyes.

In the synthesis of the squarylium dye represented by the formula (I), carboxyindolenine is synthesized from hydrazinobenzoic acid as a raw material and then subjected to a reaction with an alkyl halide to synthesize an alkylated carboxyindolenine salt. Then, the alkylated carboxyindolenine salt may be subjected to a reaction with squaric acid to synthesize the squarylium dye.

The carboxyindolenine may be synthesized with reference to Bioconjugate Chem. 2003, Vol. 14, 1048-1051.

An N-alkylcarboxyindolenine salt may be synthesized with reference to Dyes and Pigments, 11, 1989, p 21-35. N-alkylcarboxyindolenine salts having different numbers of carbon atoms may be synthesized using alkyl halides having different numbers of carbon atoms in alkyl groups.

The squarylium dye represented by the formula (1) may be synthesized using an N-alkylcarboxyindolenine salt and squaric acid with reference to Dyes And Pigments, 11, 1989, p 21-35.

The squarylium dye represented by the formula (2) may be synthesized with reference to Non Patent Literature 2. In the following formula, R represents a substituted or unsubstituted C2 to C30 alkyl group, preferably n-$C_{12}H_{25}$. It should be noted that R corresponds to $R_3$ in the formula (2).

In the case where $R_3$ represents a substituted alkyl group, preferred examples of the substituent include a halogen, a carboxy group, and a sulfone group. In the case where the substituent has a carbon atom, the carbon atom is included in the number of carbon atoms. $R_3$ represents preferably a substituted or unsubstituted C2 to C30 alkyl group, more preferably a branched or linear C12 alkyl group, still more preferably a C12 n-alkyl group.

The squarylium dye represented by the formula (2) is preferably used as a dye for the photoelectric conversion element or dye-sensitized solar cell of the present invention singly or in combination with the squarylium dye represented by the formula (1). The squarylium dye represented by the formula (2) is also the squarylium dye of the present invention. The squarylium dye represented by the formula (2) may be obtained as an intermediate of the squarylium dye represented by the formula (1). From the viewpoint of the intermediate of the squarylium dye represented by the formula (1), $R_3$ is preferably identical to $R_1$ and $R_2$.

The squarylium dye represented by the formula (2) has an absorption region at the relatively low wavelength side, and hence is excellent as a dye for a photoelectric conversion element or a dye-sensitized solar cell in a low wavelength region. Further, the use of the dye in combination with the squarylium dye represented by the formula (1) enables light absorption in a wide range of region, thereby providing a good photoelectric conversion element. Further, the squarylium dye represented by the formula (2) is obtained by hydrolyzing the intermediate of the squarylium dye represented by the formula (1), and hence the dye has advantages not only in that the dye may be synthesized using similar raw materials but also in that deterioration due to an interaction caused by the combined use of the dyes is difficult to occur because the dyes have similar characteristics. In the case where the squarylium dye represented by the formula (1) is used in combination with the squarylium dye represented by the formula (2), the use ratio of the dyes falls within the range of preferably 0.3 to 10, more preferably 1 to 4 in terms of (1)/(2).

While an absorption wavelength region of a sensitizing dye in the dye-sensitized solar cell may be selected depending on a light source used, the squarylium dye represented by the formula (1) or formula (2) may be used, and if necessary, another dye may also be selected so that the wavelength region matches a wavelength region of the light source of interest. Such dye preferably has any appropriate bonding group (interlocking group) to the surface of a semiconductor particle. Preferred examples of the bonding group include —COOH, —SO$_3$H, —CN, —P(O)(OH)$_2$, —OP(O)(OH)$_2$, and —OH, or chelating groups having n-conductivity such as oxime, dioxime, hydroxyquinoline, salicylate, and α-ketoenolate. Of those, —COOH is preferred, and the squarylium dyes represented by the above-mentioned formula (1) and formula (2) are preferred because the dyes have —COOH.

Figure 1:
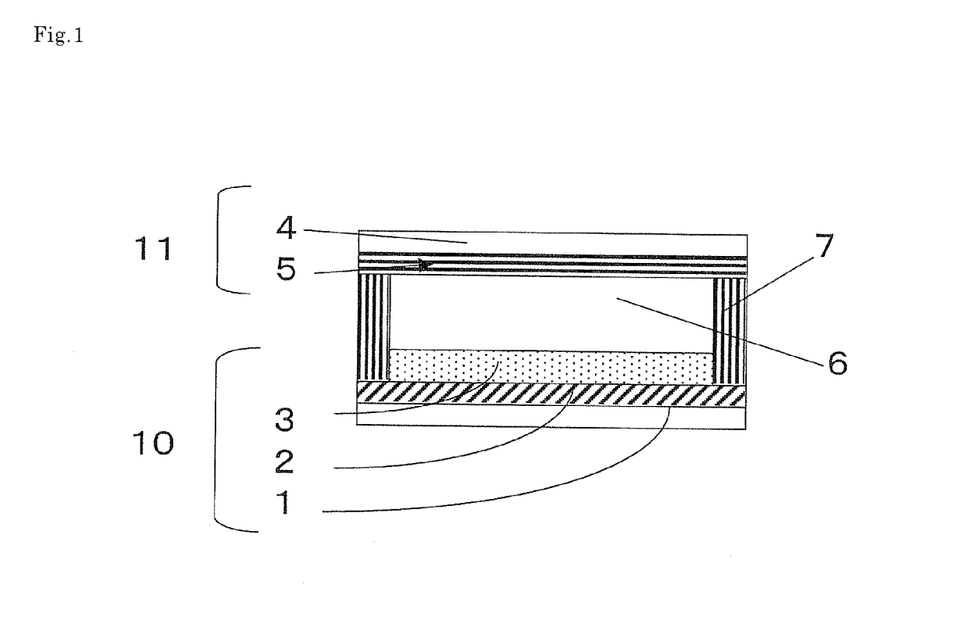
FIG. 1 is a cross-sectional view showing one example of a dye-sensitized solar cell.

One example of a basic construction of the photoelectric conversion element or dye-sensitized solar cell using the dye of the present invention is described based on FIG. 1. In this figure, a substrate is represented by 1, a transparent conductive film is represented by 2, a dye-adsorbed metal oxide layer is represented by 3, a substrate is represented by 4, a conductive film is represented by 5, an electrolyte solution is represented by 6, a spacer 7, a surface electrode is represented by 10, and a counter electrode is represented by 11.

FIG. 1 is a cross-sectional view showing one example of the photoelectric conversion element. The photoelectric conversion element includes the surface electrode 10 having the conductive layer 2 and a semiconductor layer, which is constructed of one or more layers and has adsorbed thereto a dye for sensitization, on the substrate 1, and the counter electrode 11 having the conductive layer 5 provided on the substrate 4, and includes the electrolyte 6 between both of the electrodes. The dye-adsorbed semiconductor layer 3 is also referred to as semiconductor electrode because the layer constructs a part of the electrode. The dye-adsorbed semiconductor layer 3 is a layer obtained by applying and sintering titania or metal oxide fine particles as one layer or includes layers formed by applying and sintering titania or metal oxide fine particles more than once, and the layer is a semiconductor layer having adsorbed thereto the dye and includes metal oxide particles such as titanium oxide particles and a sensitizing dye which is present so as to cover the surfaces of the particles. It should be noted that light enters from the surface electrode 10 side. In addition, the dye-sensitized solar cell of the present invention has a basic construction similar to the above-mentioned one but is designed so that the solar cell works in an external circuit. Moreover, a method of producing the dye-sensitized solar cell using the photoelectric conversion element is known in Patent Literatures 1 and 2 described above and the like, and such known methods may be employed.

The substrate 1 is not particularly limited as long as the substrate is a transparent insulating material, and examples thereof include a usual glass plate or plastic plate. In addition, the substrate may be a material having flexibility such as a PET resin, and is preferably a heat-resistant material having an ability to endure a step of baking titanium oxide at about 500° C. or less, such as a transparent glass plate.

Next, the conductive layer 2, which does not impair transparency of the substrate, is provided on the surface of the substrate 1, and the conductive layer may be ITO, FTO, or ATO, which is known as the so-called transparent electrode, or a combination thereof, and may be a metal layer having a thickness which does not impair transparency. A method of providing the conductive layer is not particularly limited, and known methods such as sputtering, deposition (including CVD and PVD), spray, laser ablation, or methods using materials processed into pastes, such as spin coating, bar coating, and screen printing may be used. Of those, a spray method, or sputtering or a deposition method carried out in a gas phase is preferred.

The dye-adsorbed semiconductor layer 3 is provided on the conductive layer. Usually, a metal oxide layer is formed as a semiconductor, and a sensitizing dye is then adsorbed to the layer. As the metal oxide, a material which is known as a photoelectric conversion material may be used, and examples thereof include titanium oxide, zinc oxide, and tungsten oxide. Of those, titanium oxide is preferred. Titanium oxide may be anatase-type, rutile-type, or brookite-type titanium dioxide, or may be titanium hydroxide or hydrous titanium oxide. Meanwhile, at least one of elements Nb, V, and Ta may be doped to titanium oxide at a weight concentration of 30 ppm to 5% (as a metal element). Such metal oxide may be used in the present invention and is preferably a fine particle having an average particle size ranging from 5 to 500 nm, preferably from 10 to 200 nm.

While the metal oxide layer is formed on the transparent electrode 2, the method is not particularly limited, and methods such as spin-coating, printing, or spray-coating for the metal oxide processed into a paste may be used. Further, after film formation, sintering may be carried out to sinter the metal oxide such as titanium oxide. Next, a dye for sensitization is adsorbed to the metal oxide to produce the dye-adsorbed semiconductor layer 3 as a dye-adsorbed metal oxide.

The present invention is characterized by the sensitizing dye, and other layers or materials may have known structures or be known materials and are not limited to one having the structure shown in FIG. 1.

The materials constructing the dye-adsorbed semiconductor layer 3 are a semiconductor and a dye, and usually, the semiconductor is a metal oxide, preferably titanium oxide, and hence the semiconductor may be represented by the metal oxide or titanium oxide. Further, the dye for dye sensitization is the squarylium dye represented by the formula (1) and/or formula (2) described above. In the above-mentioned squarylium dye, the number of carbon atoms in the N-alkyl substituent alkyl group is large, and hence a good photoelectric conversion element and dye-sensitized solar cell can be provided.

The dye is dissolved in a solvent for dissolving the dye and adsorbed to a titania semiconductor layer. A solvent capable of dissolving the dye is applicable to the solvent for adsorption. Specifically, aliphatic alcohols such as methanol, ethanol, propanol, and n-butanol, nitrile solvents such as acetonitrile and propionitrile, ketones such as acetone and methyl ethyl ketone, carbonates such as dimethyl carbonate and diethyl carbonate, lactones, and caprolactams may be used. Of those, methanol, ethanol, or acetonitrile is preferred.

The dye may be adsorbed using a dye solution including a coadsorbent such as deoxycholic acid or chenodeoxycholic acid (DCA) dissolved in the dye solution.

The dye may be adsorbed after the dye is dissolved in a supercritical fluid or a pressurized fluid. Specifically, the dye is preferably adsorbed using a carbon dioxide gas or a solution prepared by adding an entrainer to a carbon dioxide gas.

To the metal oxide having adsorbed thereto the dye, a carboxylic acid may further be adsorbed in a $CO_2$ supercritical fluid. An effect of adsorbing the carboxylic acid is known in J. Photochem. and Photobio. A, Chem. 164 (2004) 117. However, as is the case with dye adsorption and rinse treatment, it is important to effectively adsorb the carboxylic acid to the inside of a fine pore of the metal oxide such as titanium oxide. The carboxylic acid may be effectively adsorbed by placing the metal oxide having adsorbed thereto the dye (which may be a substrate having a metal oxide layer having adsorbed thereto the dye) and the carboxylic acid in a $CO_2$ supercritical fluid or pressurized $CO_2$, formed at a pressure ranging from 5 to 30 Mpa and a temperature ranging from 40 to 60° C. Preferred examples of the carboxylic acid include benzoic acid, acetic acid, anisic acid, and nicotinic acid. The carboxylic acid is preferably used as a solution obtained by dissolving the carboxylic acid in an alcohol containing at least one kind of methanol, ethanol, propanol, and butanol, and the concentration of the carboxylic acid preferably falls within the range of 0.01 to 10 mol/L.

As mentioned above, the surface electrode 10 including the substrate 1, transparent conductive film 2, and dye-adsorbed semiconductor layer 3 serves as a negative electrode. The other electrode serving as a positive electrode (counter electrode) 11 is arranged on the opposite side of the surface electrode 10 as shown in FIG. 1. The electrode serving as the positive electrode may be a conductive metal or a product obtained by coating the substrate 4 such as a usual glass plate or plastic plate with the conductive film 5 such as a metal film or a carbon film.

An electrolyte layer is provided between the surface electrode 10 serving as the negative electrode and the counter electrode 11 serving as the positive electrode. The type of the electrolyte layer is not particularly limited as long as the layer includes redox species for reducing the dye which has been photoexcited and has injected electrons into the semiconductor, and the layer may be a liquid electrolyte or a gel-like electrolyte obtained by adding a known gelator (high-molecular-weight or low-molecular-weight gelator) or a quasi-solid obtained by kneading an ionic liquid and a metal oxide to the liquid electrolyte.

Examples of the electrolyte for an electrolyte solution include a combination of iodine and an iodide (e.g., a metal iodide such as LiI, NaI, KI, CsI, or $CaI_2$ or a quaternary ammonium compound iodine salt such as a tetraalkylammonium iodide, pyridinium iodide, or imidazolium iodide), a combination of bromine and a bromide (e.g., a metal bromide such as LiBr, NaBr, KBr, CsBr, or $CaBr_2$ or a quaternary ammonium compound bromine salt such as a tetraalkylammonium bromide or pyridinium bromide), a sulfur compound such as sodium polysulfide, an alkylthiol, or an alkyl disulfide, a viologen dye, hydroquinone, and quinone. The electrolytes may be used as a mixture.

Meanwhile, the electrolyte is preferably a molten salt electrolyte having a high boiling point. In the case where the semiconductor electrode includes the dye-adsorbed titanium oxide layer, particularly excellent solar cell characteristics can be exerted by a combination with the molten salt electrolyte. A molten salt electrolyte composition includes a molten salt. The molten salt electrolyte composition is preferably a liquid at ordinary temperature. The molten salt which is a major component is an electrolyte which is a liquid at room temperature or has a low melting point, and general examples thereof include a pyridinium salt, an imidazolium salt, and a triazolium salt described in "Electrochemistry," 1997, Vol. 65, No. 11, p. 923 and the like. The molten salts may be used singly or as a mixture of two or more thereof. The molten salts may be used in combination with an alkaline metal salt such as LiI, NaI, KI, $LiBF_4$, $CF_3COOLi$, $CF_3COONa$, LiSCN, or NaSCN. Usually, the molten salt electrolyte composition contains iodine. The molten salt electrolyte composition preferably has low volatility and preferably does not contain a solvent. The molten salt electrolyte composition may be gelatinized before use.

In the case where a solvent is used in the electrolyte, the solvent is desirably a compound which can exert a low viscosity, a high ionic mobility, and excellent ion conductivity. Examples of such solvent include carbonate compounds such as ethylene carbonate and propylene carbonate, heterocyclic compounds such as 3-methyl-2-oxazolidinone, ether compounds such as dioxane and diethyl ether, linear ethers such as an ethylene glycol dialkyl ether, a propylene glycol dialkyl ether, a polyethylene glycol dialkyl ether, and a polypropylene glycol dialkyl ether, alcohols such as methanol, ethanol, an ethylene glycol monoalkyl ether, a propylene glycol monoalkyl ether, a polyethylene glycol monoalkyl ether, and a polypropylene glycol monoalkyl ether, polyalcohols such as ethylene glycol, propylene glycol, polyethylene glycol, polypropylene glycol, and glycerin, nitrile compounds such as acetonitrile, glutarodinitrile, methoxyacetonitrile, propionitrile, and benzonitrile, aprotic polar substances such as dimethyl sulfoxide and sulfolane, and water. Those solvents may be used as a mixture.

A method of providing the electrolyte layer is not particularly limited, and the method may be, for example, a method involving forming a space by arranging the film-like spacer 7 between both of the electrodes and injecting the electrolyte in the space, or a method involving applying the electrolyte to the inside of the negative electrode and mounting the positive electrode at appropriate intervals. In order to prevent the leakage of the electrolyte, it is desirable to seal both of the electrodes and peripheries thereof, but the sealing method and sealing material are not particularly limited.

EXAMPLES

Hereinafter, the present invention is described in more detail based on examples and comparative examples. It should be noted that Synthesis Examples 1 to 3 and 10 to 14 are understood as examples.

Synthesis Example 1

Carboxyindolenine was synthesized using 4-hydrazinobenzoic acid and methyl isopropyl ketone. 78.87 mmol of 4-hydrazinobenzoic acid, 160.92 mmol of sodium acetate, and 123.46 mmol of methyl isopropyl ketone were added to 180 ml of glacial acetic acid, and the mixture was subjected to a reaction under nitrogen at 120° C. for 7 hours. Acetic acid was distilled off and the resultant solid was dispersed in a solution of water:methanol=9:1 and filtered. The solid was added to 70 g of methanol and the mixture was heated to 30° C. and filtered. 160 g of water were added to the filtrate for crystallization and the crystal was filtrated. The resultant solid was washed with 35 ml of a solution of water:methanol=9:1 and dried in vacuum to afford 37.7 mmol of carboxyindolenine.

In order to synthesize an N-n-alkylcarboxyindolenine salt, 0.1 mol of 2,3,3-trimethyl-5-carboxy-indolenine and 1-iodooctane were dissolved in 20 ml of ethanol and the mixture was subjected to a reaction for 7 hours while being refluxed. The solid was filtered to afford 1-n-octyl-2,3,3-trimethyl-5-carboxy-indolenium iodide in a yield of 55%.

Figure 2:
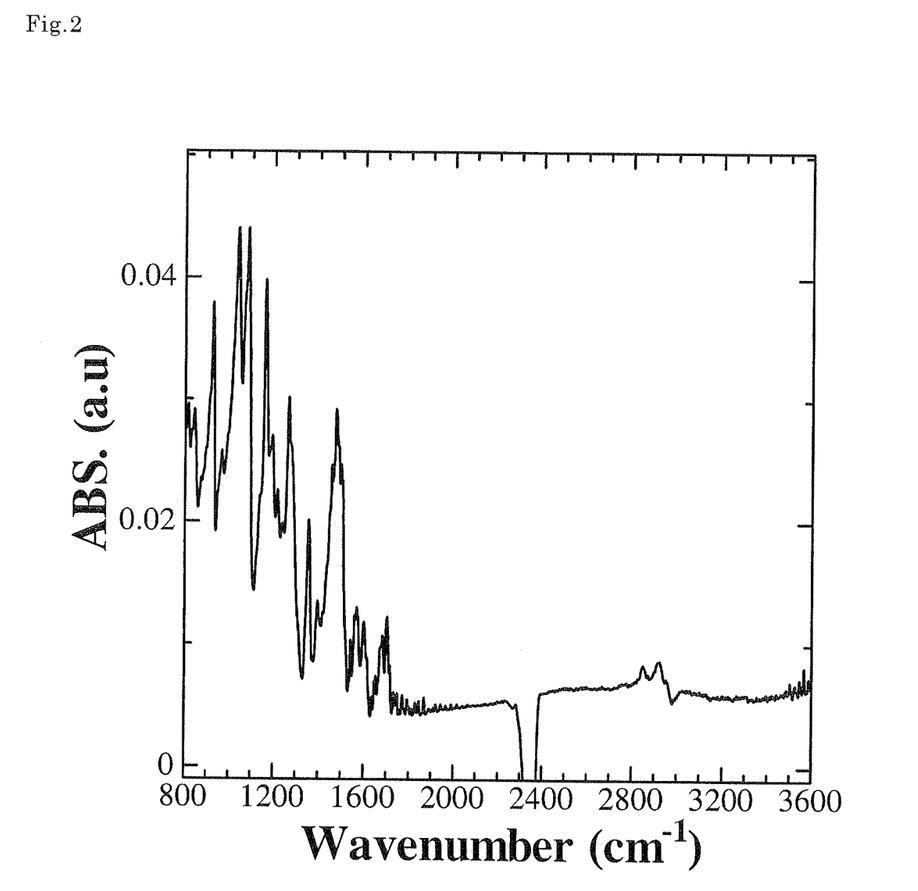
FIG. 2 is an IR spectrum of a squarylium dye D-4 of the present invention.

In order to synthesize a squarylium dye, 0.7 mmol of 1-n-octyl-2,3,3-trimethyl-5-carboxy-indolenium iodide and 3 mmol of squaric acid were dissolved in a solvent obtained by adding 1 ml of quinoline to 40 ml of a solvent of benzene:butanol=1:4 (volume ratio) and the mixture was refluxed while removing water and subjected to a reaction for 15 hours. The mixture was cooled to room temperature, and the solid was filtered. The solid was washed with diethyl ether to afford a squarylium dye D-4. The IR spectrum, MS spectrum, and 1H-NMR spectrum (solvent: DMSO-d6) of the squarylium dye D-4 were measured. FIG. 2 shows the IR spectrum.

Synthesis Examples 2 and 3

Squarylium dyes D-5 and D-6 were obtained in the same manner as in Synthesis Example 1 except that 1-iodododecane or 1-iodooctadecane was used instead of 1-iodooctane in the synthesis of the carboxyindolenine salt.

Synthesis Example 4

A squarylium dye D-1 was synthesized in the same manner as in Synthesis Example 1 except that carboxyindolenine was used as the carboxyindolenine salt.

Synthesis Example 5

A squarylium dye D-2 was synthesized in the same manner as in Synthesis Example 1 except that a carboxyindolenine salt obtained by using 2-iodoethane instead of 1-iodooctane in Synthesis Example 1 was used as the carboxyindolenine salt.

Synthesis Example 6

A squarylium dye D-3 was synthesized in the same manner as in Synthesis Example 1 except that a carboxyindolenine salt obtained by using 2-iodobutane instead of 1-iodooctane in Synthesis Example 1 was used as the carboxyindolenine salt.

Synthesis Example 7

A squarylium dye D-7 was synthesized in the same manner as in Synthesis Example 1 except that an indolenine salt obtained by using 2-iodopropionic acid instead of 1-iodooctane and 2,3,3-trimethyl-indolenine instead of 2,3,3-trimethyl-5-carboxy-indolenine in Synthesis Example 1 was used as the carboxyindolenine salt.

Synthesis Example 8

A squarylium dye D-8 was synthesized with reference to J. Am. Chem. Soc. 129, p 10320-10321 using two kinds of indolenine salts, i.e., an indolenine salt obtained by using iodomethane instead of 1-iodooctane in Synthesis Example 1 as the carboxyindolenine salt and a carboxyindolenine salt obtained by using iodooctane in Synthesis Example 1 as the carboxyindolenine salt.

Synthesis Example 9

A squarylium dye D-9 was synthesized in the same manner as in Synthesis Example 8 using two kinds of indolenine salts, i.e., an indolenine salt obtained by using iodoethane instead of 1-iodooctane in Synthesis Example 1 as the carboxyindolenine salt and a carboxyindolenine salt obtained by using iodooctane in Synthesis Example 1 as the carboxyindolenine salt.

Synthesis Example 10

In order to synthesize an N-n-alkylcarboxyindolenine, 0.1 mol of 2,3,3-trimethyl-5-carboxy-indolenine and 0.11 mol of 1-iodododecane were dissolved in 20 ml of ethanol and the mixture was subjected to a reaction for 7 hours while being refluxed. The solid was filtered to afford 1-n-dodecyl-2,3,3-trimethyl-5-carboxy-indolenium iodide in a yield of 50%. With reference to Non Patent Literature 2, 0.04 mol of 1-n-dodecyl-2,3,3-trimethyl-5-carboxy-indolenium iodide, 0.05 mol of 3,4-diethoxy-3-cyclobutene-1,2-dione, and 2 ml of triethylamine were dissolved in 10 ml of ethanol and the mixture was refluxed for 1 hour. The solvent was distilled off and the resultant crude product was purified using a column to afford 0.028 mol of an intermediate of the squarylium dye represented by the following formula (3) in a yield of 70%.

(3)

Figure 3:
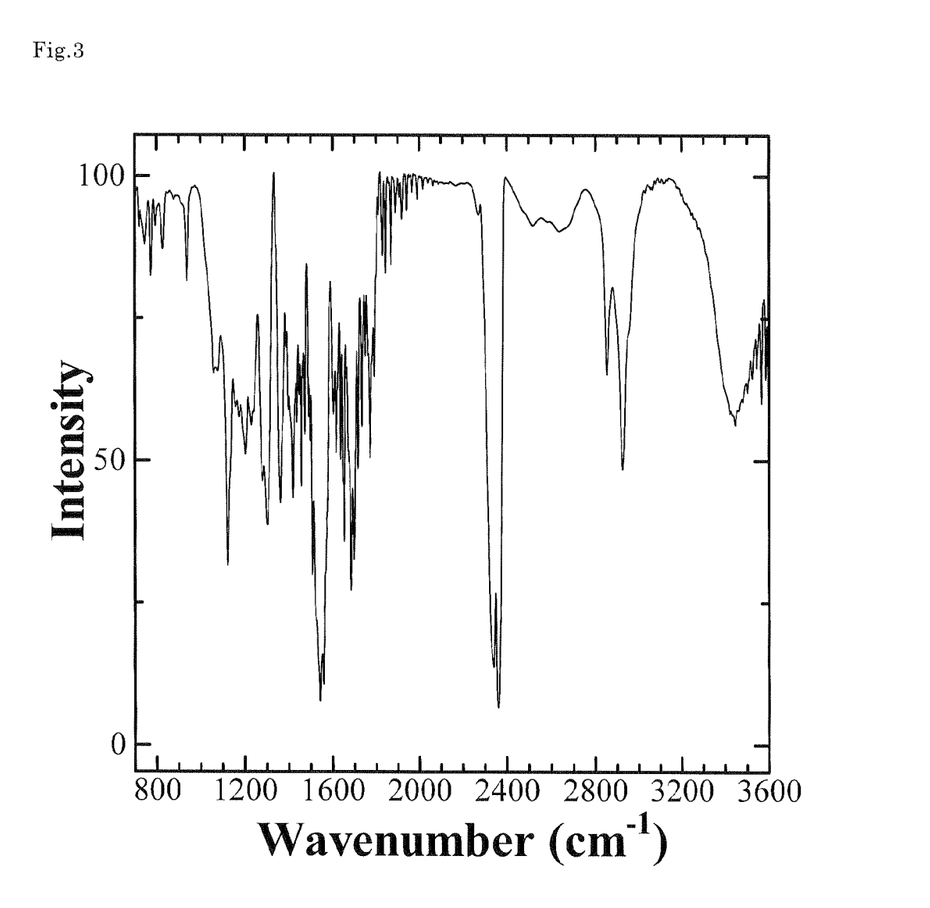
FIG. 3 is an IR spectrum of a squarylium dye D-10 of the present invention.

Subsequently, in order to hydrolyze the intermediate, the intermediate represented by the formula (3) (800 mg, 1.7 mmol), 20 ml of ethanol, and 2.0 ml of an aqueous solution of 40% NaOH were added to an eggplant-shaped flask and the mixture was refluxed for 1 hour. After that, the solvent was evaporated using an evaporator, and 1.5 ml of an aqueous solution of 20% HCl were added thereto. The residue was purified by column chromatography to afford 250 mg of a squarylium dye D-10 in a yield of 32%. FIG. 3 shows the IR spectrum of the squarylium dye D-10.

Synthesis Example 11

A squarylium dye D-11 was obtained in the same manner as in Synthesis Example 10 except that 1-iodoethane was used instead of 1-iodododecane in the synthesis of the carboxyindolenine salt.

Synthesis Example 12

A squarylium dye D-12 was obtained in the same manner as in Synthesis Example 10 except that 1-iodobutane was used instead of 1-iodododecane in the synthesis of the carboxyindolenine salt.

Synthesis Example 13

A squarylium dye D-13 was obtained in the same manner as in Synthesis Example 10 except that 1-iodooctane was used instead of 1-iodododecane in the synthesis of the carboxyindolenine salt.

Synthesis Example 14

A squarylium dye D-14 was obtained in the same manner as in Synthesis Example 10 except that 1-iodooctadecane was used instead of 1-iodododecane in the synthesis of the carboxyindolenine salt.

Tables 1 and 2 show chemical formulae, maximum absorption wavelengths, and absorption edges of the squarylium dyes D-1 to D-14 obtained in Synthesis Examples 1 to 14.

TABLE 1

| Dye Number | X | R1 | R2 | A | B | Maximum absorption wavelength (nm) | Absorption Edge (nm) |
|---|---|---|---|---|---|---|---|
| D-1 | C(CH3)2 | H | H | COOH | COOH | 665 | 720 |
| D-2 | C(CH3)2 | C2H5 | C2H5 | COOH | COOH | 635 | 720 |
| D-3 | C(CH3)2 | n-C4H9 | n-C4H9 | COOH | COOH | 642 | 700 |
| D-4 | C(CH3)2 | n-C8H17 | n-C8H17 | COOH | COOH | 646 | 700 |
| D-5 | C(CH3)2 | n-C12H25 | n-C12H25 | COOH | COOH | 648 | 720 |
| D-6 | C(CH3)2 | n-C18H37 | n-C18H37 | COOH | COOH | 648 | 700 |
| D-7 | C(CH3)2 | n-C2H4COOH | n-C2H4COOH | H | H | 648 | 710 |
| D-8 | C(CH3)2 | n-C8H17 | CH3 | COOH | H | 640 | 680 |
| D-9 | C(CH3)2 | n-C8H17 | C2H5 | COOH | H | 640 | 690 |

TABLE 2

| Dye number | R3 | Maximum absorption wavelength (nm) | Absorption edge (nm) |
|---|---|---|---|
| D-10 | n-C12H25 | 450 | 380 |
| D-11 | n-C2H5 | 455 | 390 |
| D-12 | n-C4H9 | 458 | 393 |
| D-13 | n-C8H17 | 460 | 398 |
| D-14 | n-C18H37 | 467 | 402 |

Example 1

A glass substrate with a fluorine-doped tin oxide (FTC) film manufactured by Nippon Sheet Glass Co., Ltd. (product name: Low-E glass) was used as a glass substrate with a transparent conductive film measuring 30 mm×25 mm×3 mm.

Subsequently, a titanium oxide film was formed on the conductive film of the substrate with a conductive film. As titanium oxide, a commercially available titanium oxide paste (D paste manufactured by Solaronix SA) was used. The paste was applied onto the conductive film of the substrate with a conductive film in an area of 5 mm×5 mm by a squeegee printing method, dried, and sintered at 450° C. to afford a laminate plate including a titanium oxide layer with a thickness of 15 μm.

D-4 was used as the dye. The dye was dissolved in ethanol at $3 \times 10^{-4}$ mol/L. The dye was adsorbed by dissolving the dye in a solvent to prepare a solution, placing the resultant dye solution in a container, arranging the laminate plate including the titanium oxide layer formed, and taking the laminate plate having adsorbed thereto the dye out of the container.

A sheet-like thermoplastic adhesive (DU-PONT MITUI POLYCHEMICALS, product name; HIMILAN sheet) made of an ionomer resin having a thickness of 50 μm was attached to four sides measuring 5 mm×5 mm of the periphery of the laminate plate in which the titanium oxide film was formed so that a space with a size of about 1 mm was provided on two parts of the periphery to inject the electrolyte. The thermoplastic adhesive plays a role as a sealant and as a spacer between both of the electrodes. Subsequently, a glass substrate where a platinum film with a thickness of 10 nm serving as the positive electrode was formed by the sputtering method was attached via the thermoplastic adhesive film so that the platinum side was arranged on the opposite side of the titanium oxide side. A space between the substrate and positive electrode was filled with an acetonitrile solution containing 0.5 M of LiI, 0.5 M of t-butylpyridine, and 0.05 M of iodine as major components from a space in the thermoplastic adhesive film by a capillary action. Immediately after the space was filled with the electrolyte, the space was sealed with an epoxy resin adhesive to afford a photoelectric conversion element.

Example 2

A photoelectric conversion element was obtained in the same manner as in Example 1 except that adsorption was carried out using a solution obtained by dissolving the dye D-4 and DCA in ethanol at $3 \times 10^{-4}$ mol/L and $3 \times 10^{-3}$ mol/L, respectively.

Example 3

The laminate plate including the titanium oxide layer with a thickness of 15 μm prepared in Example 1 was immersed in an aqueous solution of 40 mmol/l $TiCl_4$ at 70° C. for 30 minutes and washed with water and ethanol. After that, the plate was heated at 325° C. for 5 minutes, at 375° C. for 5 minutes, at 450° C. for 15 minutes, and at 500° C. for 30 minutes. A photoelectric conversion element was obtained in the same manner as in Example 2 except that the dye D-4 was adsorbed on the laminate plate in combination with DCA.

Example 4

A photoelectric conversion element was obtained in the same manner as in Example 1 except that the dye D-5 was used instead of the dye D-4.

Example 5

A photoelectric conversion element was obtained in the same manner as in Example 2 except that the dye D-5 was used instead of the dye D-4.

Example 6

A photoelectric conversion element was obtained in the same manner as in Example 3 except that the dye D-5 was used instead of the dye D-4.

Example 7

A photoelectric conversion element was obtained in the same manner as in Example 1 except that the dye D-6 was used instead of the dye D-4.

Example 8

A photoelectric conversion element was obtained in the same manner as in Example 2 except that the dye D-6 was used instead of the dye D-4.

Example 9

A photoelectric conversion element was obtained in the same manner as in Example 3 except that the dye D-6 was used instead of the dye D-4.

Example 10

A photoelectric conversion element was obtained in the same manner as in Example 1 except that the dye D-10 was used instead of the dye D-4.

Example 11

A photoelectric conversion element was obtained in the same manner as in Example 1 except that two kinds of dyes were mixed and adsorbed by dissolving the dyes D-5, D-10, and DCA in ethanol at $2.25 \times 10^{-4}$ mol/L, $0.75 \times 10^{-4}$ mol/L, and $3.0 \times 10^{-3}$ mol/L, respectively.

Example 12

A photoelectric conversion element was obtained in the same manner as in Example 2 except that the dye D-10 was used instead of the dye D-4.

Example 13

A photoelectric conversion element was obtained in the same manner as in Example 1 except that the dye D-11 was used instead of the dye D-4.

Example 14

A photoelectric conversion element was obtained in the same manner as in Example 1 except that the dye D-12 was used instead of the dye D-4.

Example 15

A photoelectric conversion element was obtained in the same manner as in Example 1 except that the dye D-13 was used instead of the dye D-4.

Example 16

A photoelectric conversion element was obtained in the same manner as in Example 1 except that the dye D-14 was used instead of the dye D-4.

Example 17

A photoelectric conversion element was obtained in the same manner as in Example 1 except that two kinds of dyes were mixed and adsorbed by dissolving the dyes D-5 and D-11 in ethanol at 2.25×10-4 mol/L and 0.75×10-4 mol/L, respectively.

Example 18

A photoelectric conversion element was obtained in the same manner as in Example 1 except that two kinds of dyes were mixed and adsorbed by dissolving the dyes D-5 and D-12 in ethanol at 2.25×10-4 mol/L and 0.75×10-4 mol/L, respectively.

Example 19

A photoelectric conversion element was obtained in the same manner as in Example 1 except that two kinds of dyes were mixed and adsorbed by dissolving the dyes D-5 and D-13 in ethanol at 2.25×10-4 mol/L and 0.75×10-4 mol/L, respectively.

Example 20

A photoelectric conversion element was obtained in the same manner as in Example 1 except that two kinds of dyes were mixed and adsorbed by dissolving the dyes D-5 and D-14 in ethanol at 2.25×10-4 mol/L and 0.75×10-4 mol/L, respectively.

Comparative Examples 1 to 6

A photoelectric conversion element was obtained in the same manner as in Example 1 except that the dye D-1, D-2, D-3, D-7, D-8, or D-9 was used instead of the dye D-4.

The photoelectric conversion elements produced in Examples and Comparative Examples were used to produce dye-sensitized solar cells, and characteristics of the solar cells were measured using a solar simulator. Measurement was carried out using artificial sunlight of AM 1.5 and 100 mW/cm$^2$ and characterization was carried out using an I-V curve tracer. Tables 3 and 4 show the results of measurement of the following characteristics: conversion efficiency (%), short-circuit current (Jsc: mA/cm$^2$), open-circuit voltage (Voc: V), and fill factor (ff: shape factor).

TABLE 3

| Example | Dye | Coadsorbent | TiCl4 treatment | Conversion efficiency | Jsc | Voc | ff |
|---|---|---|---|---|---|---|---|
| 1 | D-4 | none | none | 2.29 | 6.08 | 0.57 | 0.66 |
| 2 | D-4 | DCA | none | 2.65 | 6.61 | 0.58 | 0.69 |
| 3 | D-4 | DCA | yes | 2.73 | 7.03 | 0.58 | 0.67 |
| 4 | D-5 | none | none | 2.43 | 5.85 | 0.64 | 0.65 |
| 5 | D-5 | DCA | none | 3.20 | 7.60 | 0.61 | 0.69 |
| 6 | D-5 | DCA | yes | 3.56 | 8.57 | 0.62 | 0.67 |
| 7 | D-6 | none | none | 2.54 | 6.65 | 0.58 | 0.66 |
| 8 | D-6 | DCA | none | 2.92 | 7.24 | 0.62 | 0.65 |

TABLE 3-continued

| Example | Dye | Coadsorbent | TiCl4 treatment | Conversion efficiency | Jsc | Voc | ff |
|---|---|---|---|---|---|---|---|
| 9 | D-6 | DCA | yes | 3.33 | 8.26 | 0.61 | 0.66 |
| 10 | D-10 | none | none | 2.41 | 5.73 | 0.61 | 0.69 |
| 11 | D-5 + D-10 | DCA | none | 5.07 | 12.2 | 0.62 | 0.67 |
| 12 | D-10 | DCA | none | 3.07 | 7.04 | 0.63 | 0.68 |
| 13 | D-11 | none | none | 2.10 | 5.26 | 0.67 | 0.60 |
| 14 | D-12 | none | none | 1.58 | 3.59 | 0.65 | 0.67 |
| 15 | D-13 | none | none | 1.23 | 2.74 | 0.63 | 0.71 |
| 16 | D-14 | none | none | 1.18 | 2.64 | 0.60 | 0.74 |
| 17 | D-5 + D-11 | none | none | 4.77 | 11.48 | 0.62 | 0.67 |
| 18 | D-5 + D-12 | none | none | 4.24 | 10.19 | 0.63 | 0.66 |
| 19 | D-5 + D-13 | none | none | 3.89 | 9.08 | 0.63 | 0.68 |
| 20 | D-5 + D-14 | none | none | 3.82 | 9.05 | 0.63 | 0.67 |

TABLE 4

| Comp. Example | Dye | Coadsorbent | TiCl4 treatment | Conversion efficiency | Jsc | Voc | ff |
|---|---|---|---|---|---|---|---|
| 1 | D-1 | none | none | 0.43 | 1.44 | 0.47 | 0.63 |
| 2 | D-2 | none | none | 1.67 | 4.35 | 0.59 | 0.65 |
| 3 | D-3 | none | none | 1.97 | 5.51 | 0.57 | 0.63 |
| 4 | D-7 | none | none | 0.14 | 0.56 | 0.44 | 0.56 |
| 5 | D-8 | none | none | 1.87 | 5.15 | 0.56 | 0.65 |
| 6 | D-9 | none | none | 1.89 | 5.20 | 0.56 | 0.65 |

INDUSTRIAL APPLICABILITY

The photoelectric conversion element of the present invention or dye-sensitized solar cell constructed of the element has high photoelectric conversion efficiency in a near-infrared region. Further, when the squarylium dye represented by the formula (2) is used in combination with the squarylium dye represented by the formula (1), it is possible to absorb light at 400 nm to 700 nm and to further improve the photoelectric conversion efficiency by a synergistic effect of the two dyes without using an expensive Ru dye. Further, the squarylium dye of the present invention gives a photoelectric conversion element having high photoelectric conversion efficiency or a dye-sensitized solar cell constructed of the element.

The invention claimed is:

1. A dye-sensitized solar cell, comprising a squarylium dye, wherein the squarylium dye comprises at compound represented by the following formula (1):

(1)

wherein, $R_1$ and $R_2$ each represent a substituted or unsubstituted C5 to C30 alkyl group; X represents $C(CH_3)_2$; and A and B each represent a carboxy group.

2. A dye-sensitized solar cell according to claim 1, wherein $R_1$ and $R_2$ in the formula (1) each represent a substituted ter unsubstituted C5 to C18 alkyl group.

3. A dye-sensitized solar cell according to claim 1, wherein $R_1$ and $R_2$ in the formula (1) each represent a substituted or unsubstituted C8 to C12 alkyl group.

4. A dye-sensitized solar cell according to claim 1, wherein the dye-sensitized solar cell comprises a squarylium dye represented by the formula (1) and a squarylium dye represented by the following formula (2):

(2)

where $R_3$ represents a substituted or unsubstituted C2 to C30 alkyl group.

5. A dye-sensitized solar cell, comprising a squarylium dye, wherein the squarylium dye comprises a squarylium dye having a carboxyindolenine skeleton represented by the following formula (2):

(2)

where $R_3$ represents $n\text{-}C_{12}H_{25}$.

6. A photoelectric conversion element, comprising a squarylium dye, wherein the squarylium dye comprises a compound represented by following formula (1):

(1)

wherein, $R_1$ and $R_2$ each represent a substituted or unsubstituted C5 to C30 alkyl group; X represents $C(CH_3)_2$; and A and B each represent a carboxy group.

7. A squarylium dye for a photoelectric conversion element or a dye-sensitized solar cell, which is represented by the following formula (1):

(1)

(2)

wherein, $R_1$ and $R_2$ represent a substituted or unsubstituted C5 to C30 alkyl group; X represents $C(CH_3)_2$; and A and B each represent a carboxy group.

8. A squarylium dye for a photoelectric conversion element or a dye-sensitized solar cell, which is represented by the following formula (2):

where R represents n-$C_{12}H_{25}$.

9. A dye-sensitized solar cell according to claim 4, wherein $R_3$ in the formula (2) represents a branched or linear C12 alkyl group.

* * * * *